United States Patent
Mellors et al.

(10) Patent No.: US 7,231,334 B2
(45) Date of Patent: Jun. 12, 2007

(54) COUPLER INTERFACE FOR FACILITATING DISTRIBUTED SIMULATION OF A PARTITIONED LOGIC DESIGN

(75) Inventors: William K. Mellors, Clinton Corners, NY (US); Marvin J. Rich, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 826 days.

(21) Appl. No.: 10/125,198

(22) Filed: Apr. 18, 2002

(65) Prior Publication Data
US 2003/0200072 A1   Oct. 23, 2003

(51) Int. Cl.
*G06F 17/50* (2006.01)
(52) U.S. Cl. ...................................................... 703/13
(58) Field of Classification Search .................. 714/33, 714/38; 709/248; 370/218, 392; 717/141, 717/149; 703/13
See application file for complete search history.

(56) References Cited

U.S. PATENT DOCUMENTS

| | | | |
|---|---|---|---|
| 5,440,697 A | 8/1995 | Boegel et al. | 703/21 |
| 5,442,772 A | 8/1995 | Childs et al. | 703/13 |
| 5,561,787 A | 10/1996 | Amorim et al. | 703/13 |
| 5,621,670 A | 4/1997 | Maeda et al. | 703/21 |
| 5,794,005 A | 8/1998 | Steinman | 703/17 |
| 5,801,938 A | 9/1998 | Kalantery | 700/2 |
| 5,862,361 A | 1/1999 | Jain | 703/16 |
| 5,881,267 A * | 3/1999 | Dearth et al. | 703/27 |
| 5,919,250 A * | 7/1999 | Shimokawa | 709/252 |
| 5,933,794 A | 8/1999 | Stalzer | 702/123 |
| 5,956,261 A * | 9/1999 | Blaauw et al. | 703/22 |
| 6,074,427 A | 6/2000 | Fought et al. | 703/21 |
| 6,110,217 A * | 8/2000 | Kazmierski et al. | 703/14 |
| 6,134,514 A | 10/2000 | Liu et al. | 703/17 |
| 6,195,628 B1 * | 2/2001 | Blaauw et al. | 703/16 |
| 6,339,836 B1 * | 1/2002 | Eisenhofer et al. | 716/5 |

FOREIGN PATENT DOCUMENTS

| EP | 1059593 | 12/2000 |
|---|---|---|

OTHER PUBLICATIONS

Manjikian and Loucks; "High Performance Parallel Logic Simulation on a Network of Workstations", Proc. 7th Workshop on Parllel and Distributed Simulation (PADS), vol. 23, No. 1, pp. 76-84, 1993.*

(Continued)

*Primary Examiner*—Paul Rodriguez
*Assistant Examiner*—Juan Carlos Ochoa
(74) *Attorney, Agent, or Firm*—John E. Campbell; Kevin P. Radigan, Esq.; Heslin Rothenberg Farley & Mesiti, P.C.

(57) ABSTRACT

A technique for distributed processing a partitioned model is provided based on tight functional coupling of multiple submodels of the model. The technique includes, in one embodiment, providing each submodel with a generic coupler to enable processing of the submodel on any simulator instance of any simulator. Submodels coupled with the generic couplers can be processed on the same or different computing units. The generic couplers facilitate communication between submodels through a common communication directory (CCD) by using functions of a generic coupler shared library. The generic couplers further use functions of the shared library to ensure integrity of data transmitted between submodels.

45 Claims, 8 Drawing Sheets

OTHER PUBLICATIONS

Douglas J. Smith, "HDL Chip Design: A Practical Guide for Designing, Synthesizing & Simulating Asics & Fpgas Using Vhdl or Verilog", Mar. 1998, Doone Publications, ISBN: 0965193438, p. 39.*

"Packing Algorithm For Massively Distributed Simulation Engine", IBM Technical Disclosure Bulletin, D.K. Beece and D.S. Kung, vol. 34, No. 11, Apr. 1992, pp. 62-67.

"Exploiting Time Petri Net Properties for Distributed Simulation Partitioning", Chiola, G. et al., Proceedings of the Twenty-Sixth Hawaii International Conference on System Sciences, Wailea, Jan. 5-8, 1993, vol. 2, pp. 194-203.

"Research of Distributed Discrete Event Simulation System Processes Scheduling and Communication", Xu Weimin, Beijing International Conference on System Simulation and Scientific Computing, Bejing, Oct. 23-26, 1989, vol. 1, pp. 382-386.

"dCONES: a Distributed Concurrent Environment for VLSI Circuit Simulation", Salama, R. et al., SCS Multiconference on Multiprocessors and Array Processors, San Diego, Feb. 3-4, 1988, Proceedings of MAPCON IV: Special Processing, pp. 38-43.

"Hybrid Model for Distributed and Concurrent Simulation", Hou, T.Y. et al., SCS Multiconference on Distributed Simulation, San Diego, Feb. 3-5, 1988, Proceedings of Discributed Simulation 1988, pp. 21-24.

* cited by examiner

```
EXAMPLE OF VHDL SUBMODEL ENTITY:

entity submodel is
        port (
            clock      : in std_ulogic;
            a_input    : in std_ulogic;
            b_output   : out std_ulogic;
        );
    end;
```

*fig. 4A*

```
EXAMPLE OF GENERIC VHDL COUPLER ENTITY:

entity VHDL_Coupler_Entity is
        port (
            clock      : in std_ulogic;
            input_1    : out std_ulogic;
            output_1   : in std_ulogic;
        );
    end;
```

*fig. 4B*

EXAMPLE OF VHDL TOP LEVEL:
```
    entity VHDL_Top_Level of VHDL_Top_level is
    end:
    architecture VHDL_Top_Level of VHDL_Top_level is
        component submodel
            port (
                    clock     : in std_ulogic;
                    a_input   : in std_ulogic;
                    b_output  : out std_ulogic;
                );
        end component;

component VHDL_Coupler_Entity
            port (
                    clock     : in std_ulogic;
                    input_1   : out std_ulogic;
                    output_1  : in std_ulogic;
                );
        end component;

signal clock       : in std_ulogic;
        signal input_1     : out std_ulogic;
        signal output_1    : in std_ulogic;

begin

SUBMODEL : submodel
                port map (
                            clock     => clock,
                            a_input   => input_1,
                            b_output  => output_1
                        );

VHDL_COUPLER_ENTITY : VHDL_Coupler_Entity
                port map (
                            clock,
                            input_1,
                            output_1
                        );

end VHDL_Top_level;
``` fig. 4C

COUPLER INTERFACE FOR FACILITATING DISTRIBUTED SIMULATION OF A PARTITIONED LOGIC DESIGN

CROSS-REFERENCE TO RELATED APPLICATIONS

This application contains subject matter which is related to the subject matter of the following co-filed applications, each of which is assigned to the same assignee as this application. Each of the below-listed applications is hereby incorporated herein by reference in its entirety:

"FACILITATING SIMULATION OF A MODEL WITHIN A DISTRIBUTED ENVIRONMENT", Rich et al., Ser. No. 10/124,982, filed Apr. 18, 2002, published on Nov. 6, 2003 as U.S. Publication No. US 2003/0208350 A1, and now U.S. Pat. No. 7,158,925, and "PARTITIONING A MODEL INTO A PLURALITY OF INDEPENDENT PARTITIONS TO BE PROCESSED WITHIN A DISTRIBUTED ENVIRONMENT", Rich et al., Ser. No. 10/125,217, filed Apr. 18, 2002, published on Oct. 23, 2003 as U.S. Publication No. US 2003/0200073 A1, and now U.S. Pat. No. 7,124,071.

TECHNICAL FIELD

The present invention relates, in general, to model simulation, and in particular, to techniques for tightly functionally coupling submodels of a partitioned model for concurrent distributed submodel simulation runs.

BACKGROUND OF THE INVENTION

Model simulation has been a significant "tool" in the design and prediction of performance of real systems. Model simulation also serves to generate performance predictions for new system applications prior to their implementation. The need for model simulation is imperative for complex systems where the risks of designing the wrong system can be enormous.

Distributed simulations are simulation environments where the system at hand is partitioned into component submodels allocated to different computer workstations for execution.

Generally, distributed simulation necessitates that the cooperating workstations executing system submodels exchange time stamped event information; indicating at a minimum the next event each workstation is to execute as well as the scheduled time for the execution. The prior art deploys two types of models for distributed simulation: (a) "optimistic" models, and (b) "conservative" models.

Optimistic models do not attempt to sequence the execution of events processed by different processors. Instead, such models allow each workstation to execute its own event sequence assuming independence among the events processed by the different workstations. At the same time, these models implement mechanisms for detection of causality errors and subsequent recovery through rollback.

Conservative models, on the other hand, are based on complete avoidance of causality errors by implementing lookahead algorithms that identify interdependencies among events executed by different workstations. Thus, such models allow processing of an event by a workstation, only when it is determined that the event in question will not be affected by the results of events that are currently being processed or are to be processed next by the rest of the workstations.

Most notable among the shortcomings of the optimistic approach is the fact that the required detection and rollback mechanisms are very complex and difficult to implement.

Conservative models, while not incurring the aforementioned overheads and instabilities, do, however, require efficient and complex lookahead algorithms that identify and exploit event parallelism in order to achieve good performance. This is a serious problem considering that many applications do not allow the development of such efficient algorithms. Another problem with conservative models concerns the fact that users need to possess detailed knowledge of the deployed event synchronization scheme, so that they can "tune" the model for the particular application/experiment being simulated.

Another shortcoming, common to both classes of models, is their reliance on special (as opposed to commercial off-the-shelf) software developed for specialized research or applications programs. Yet another common shortcoming is that all workstations are required to run instances of the same simulator.

In view of the above, a need exists in the art for a generic mechanism which allows workstations running instances of the same or different simulators to communicate, and which provides simple detection and rollback mechanisms.

SUMMARY OF THE INVENTION

The shortcomings of the prior art are overcome and additional advantages are provided through the provision in one aspect of a method of processing multiple submodels of a partitioned model. This method includes, for instance, coupling these multiple submodels using multiple couplers, each interfaced with a corresponding submodel and a common buffer, and collectively processing the multiple submodels, wherein the multiple submodels communicate employing the multiple couplers and the common buffer.

In another aspect of the invention, the collectively processing of the multiple submodels includes using multiple instances of different simulators to enable specific processing of each submodel according to the goals of a simulation process.

In yet another aspect of the present invention, data in the buffer is automatically checked for correctness and retransmitted, if needed.

Systems and computer program products corresponding to the above-summarized methods are also described and claimed herein.

Aspects of the present invention advantageously enable the distributed processing of models, while avoiding any need to access the source code of licensed hardware simulators, by using a shared coupler library and an application programming interface of the licensed hardware simulators. The present invention enables hubless distributed processing, i.e., processing with distributed control, by allowing submodels to communicate directly with each other. Further, the model processing technique presented herein involves no specific requirements or limitations on the computing units, their architectures, their operating systems, and the programming languages used in the licensed hardware simulators. This is accomplished by using generic functions of the shared coupler library to directly communicate with the application programming interface of the licensed hardware simulators and by not relying on specific features of various architectures and/or operating systems.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctively claimed in the claims at the conclusion of the specification. The foregoing and other objects, features, and advantages of the invention will be apparent from the following detailed description taken in conjunction with the accompanying drawings in which:

FIG. 4A depicts one example of a submodel represented using VHDL, in accordance with an aspect of the present invention;

FIG. 4B depicts one example of a generic coupler entity represented using VHDL, in accordance with an aspect of the present invention;

FIG. 4C depicts one example of a VHDL top level entity, in accordance with an aspect of the present invention;

BEST MODE FOR CARRYING OUT THE INVENTION

Figure 1:
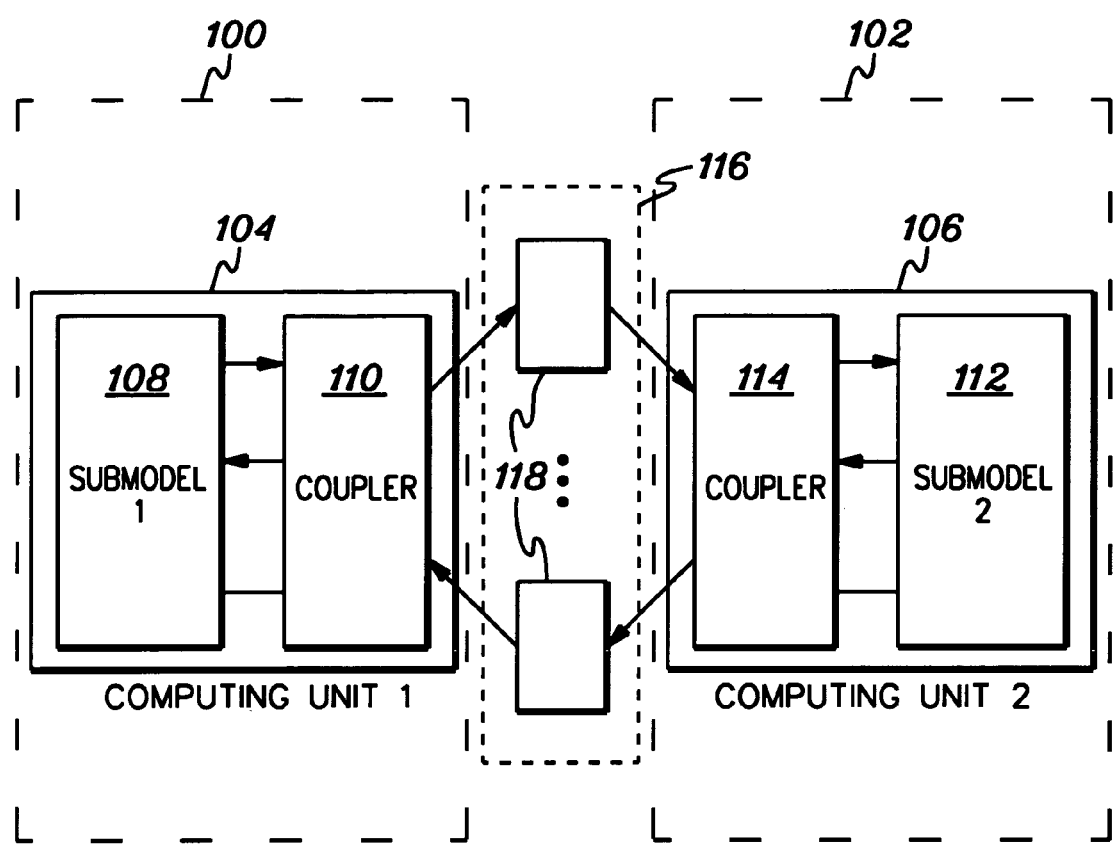
FIG. 1 depicts one embodiment of a communication environment for collectively processing submodels, in accordance with aspects of the present invention.

In accordance with one or more aspects of the present invention, a technique for collectively processing a model, partitioned into multiple submodels, is provided. This technique facilitates processing of a model by providing a generic communication mechanism to connect, for example, instances of the same licensed hardware simulator or different licensed hardware simulators or licensed programs processing multiple submodels.

One embodiment of a distributed simulation system, incorporating and using aspects of the present invention, is described below with reference to FIG. 1. This distributed computing environment includes a computing unit 100 running an instance of a licensed hardware simulator 104 and a computing unit 102 running an instance of a licensed hardware simulator 106. Each computing unit is, for instance, an International Business machines (IBM) RISC/6000 computer running AIX, a UNIX based operating system offered by IBM. In one embodiment, instances 104 and 106 are instances of different licensed hardware simulators, such as VSIM, offered by Model Technology of Portland, Oreg., and PSIM, offered by International Business Machines Corporation of Armonk, N.Y. In another embodiment, however, instances 104 and 106 may be instances of the same licensed hardware simulator.

Instance 104 processes a submodel 108 interfaced with a coupler 110, while instance 106 processes a submodel 112 interfaced with a coupler 114. Submodels 108 and 112 are produced by partitioning a model of hardware to be processed. Further details of various partitioning techniques are discussed in the literature and are provided in the above-incorporated, co-filed applications. One example of hardware model partitioning is described below with reference to FIGS. 2A, 2B & 2C, while one embodiment of a generic coupler in accordance with an aspect of the present invention, as well as a method of interfacing a submodel with the coupler, is described below with reference to FIG. 3.

Continuing with FIG. 1, couplers 110 and 114 are interfaced with a buffer 116, which generally comprises a communication medium accessible by couplers 110 and 114 to enable submodels 108 and 112 to communicate. As one example, the communication medium could be a storage device using the Andrew File System (AFS), offered by IBM. AFS is a distributed filesystem that enables co-operating hosts to efficiently share filesystem resources across both local area and wide area networks. This feature allows the use of AFS in the present invention. Further, the storage device can comprise a common communication directory (CDD). This CCD would include a plurality of files 118 read and write accessible by couplers 110 and 114. In one embodiment, this plurality of files could exist in the CCD before commencing processing of a model or partitioned submodels. A plurality of files 118 can be used to transmit data between submodels 108 and 112 via couplers 110 an 114. In one example, coupler 110 obtains data from submodel 108 and writes it to at least one file of the plurality of files 118. Subsequently, coupler 114 reads data from this file and passes this data to submodel 112. Transmission of data from submodel 112 to submodel 108 occurs in an analogous way. By way of example, one embodiment of logic used to write data to a file is described further below with reference to FIG. 5 and an embodiment of logic used to read data from a file is discussed below with reference to FIG. 6.

In one embodiment, the plurality of files 118 can comprise two files. In this embodiment, one file can be used to transmit data from submodel 108 to submodel 112, while the other can be used to transmit data from submodel 112 to submodel 108.

In another embodiment, a series of files can be used to transmit data between multiple submodels for faster input and output speed. As one example, data can be written to a series of files in a predefined order. This data can then be read from the series of files in the same predefined order. Thus, spacing between writes would be guaranteed, and the coupler that is going to write data to the buffer does not need to check whether a file in the buffer can be overwritten. In one example, the series of files is written and read in a deterministic round-robin fashion. The entire collective processing of submodels should advance through a number of coupling exchanges of data before any one file would be rewritten by any coupler. This ensures that a submodel which is processed faster can output at least some data without waiting. Similarly, on the input side, a submodel which is processed slower would be guaranteed to have input data to read.

The above-described system and computing units are only offered as examples. The communication interface of the present invention can be incorporated in or used with many types of computing units, computers, processors, nodes, systems, workstations and/or environments without departing from the spirit of the invention. For example, one or more of the units could be based on a UNIX architecture or may include an Intel PC architecture. Additionally, while some of the embodiments described herein include only two computing units processing two submodels, any number of computing units processing any number of submodels could be used. Moreover, any type of communication medium that preserves the communication protocols described herein can be used, such as networking via packet or message transmission/reception. Also, other types of systems could benefit from the present invention, and are thus considered a part of the present invention. Furthermore, the aforesaid methods involve no specific requirements for the operating systems used in the computing units, or for the programming languages used or implicit in the licensed hardware simulators or licensed programs in the instances.

Figure 2A:
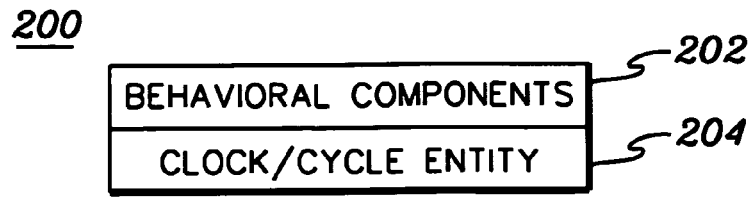
FIG. 2A depicts one example of a model to be simulated in accordance with an aspect of the present invention.

As noted, one embodiment of a model to undergo simulation using the capabilities of the present invention is described below with reference to FIGS. 2A, 2B & 2C. The unpartitioned model 200 includes, for instance, behavioral components 202 and a clock/cycle entity 204. The clock/cycle entity 204 determines when behavioral components 202 can change.

In an applications specific integrated circuit (ASIC) chip design concept, a model's behavioral components may include latches, gates and wires; whereas, the change delimiting entity would be the clock waveform value on the clock distribution wires. Behavioral components take on new values and launch new values based on cycles of the clock waveform. Clock events, such as waveform rises, are utilized by event-driven applications; whereas cycle-driven applications will utilize clock/cycle transitions. Both types of applications will use their respective entities to determine when the behavioral components of the model can change.

Figure 2B:
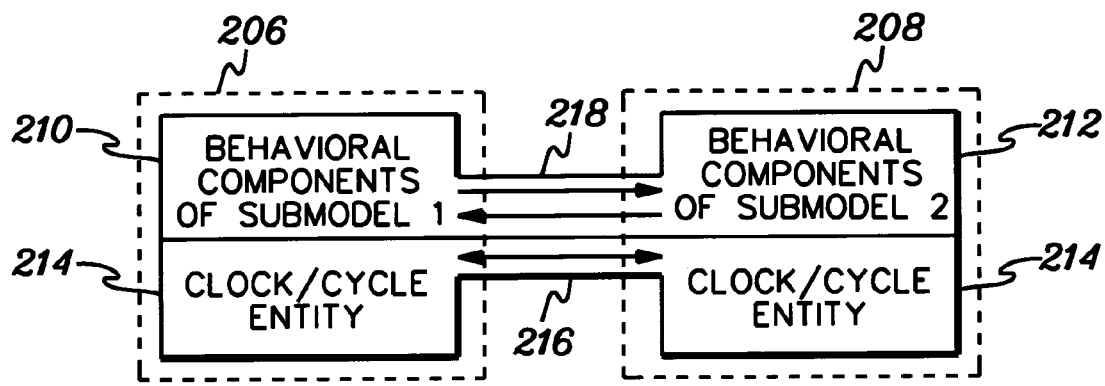
FIG. 2B depicts partitioning of the model of FIG. 2A.

In one embodiment, the model can be conceptually described as including multiple submodels internally communicating with each other, as, for example, submodels 206 and 208, shown in detail in FIG. 2B. Behavioral components 210, 212 of submodels 206 and 208 can be represented as having inputs and outputs 218. Inputs and outputs 218 are used for data exchange between submodels. Clock/cycle entity 214, which is common to both submodels, can be depicted as distributed between submodels 206 and 208 and connected via a channel 216. The model can be partitioned into submodels by separating inputs of submodel 206 from outputs of submodel 208 and vice versa, and also by dividing the clock/cycle entity between submodels along the channel 216.

Figure 2C:
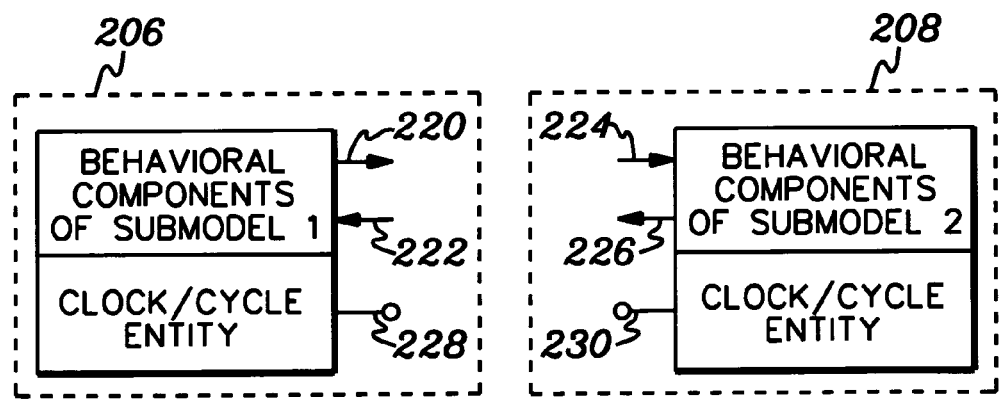
FIG. 2C depicts one example of resultant submodels, in accordance with an aspect of the present invention.

Conceptual partitioning of model 200 into submodels is depicted in FIG. 2C. The goal of the partitioning is to produce submodels, each having inputs 222 and 224, outputs 220 and 226, and also to expose the common clock/cycle entity in all submodels resulting from the partitioning. The exposed clock/cycle entity can be represented as clock/cycle ports 228 and 230 in each submodel.

Actual partitioning can be a manual process directed at a well defined interface or a algorithmic process, in which the interface is constructed. An example of an automated partitioning process is described in the above-incorporated, co-filed patent applications.

In one aspect, a generic coupler is provided herein to interface with a respective submodel to enable communication between submodels running, e.g., on different computing units. One example of such a coupler, as well as an example of the interfacing, is shown in FIG. 3.

As one embodiment, a submodel 300 is represented using VHDL (VHSIC (Very High Speed Integrated Circuits) Hardware Description Language). VHDL is a standard (VHDL-1076) developed by the Institute of Electrical and Electronics Engineers (IEEE). A submodel in VHDL, as used herein, is an entity with one or more outputs 310, one or more inputs 312 and a clock/cycle port 314. In this embodiment, coupler 302 comprises a top level coupler entity 304, which itself includes a VHDL top level entity and a generic VHDL coupler entity. In one connection format, the VHDL top level entity can be used to connect the submodel input(s), output(s) and clock/cycle port to standard ports of the generic VHDL coupler entity. The standard ports include an output port 316, an input port 318 and a clock/cycle port 320.

Within the VHDL top level entity, the submodel and the generic VHDL coupler entity are instantiated and then connected via port maps to the top level signals. One example of submodel 300 is shown in FIG. 4A, an example of a generic VHDL coupler entity is shown in FIG. 4B, and a VHDL top level entity, as well as a format of the connection between top level coupler entity 304 and submodel 300, is shown in FIG. 4C.

Figure 3:
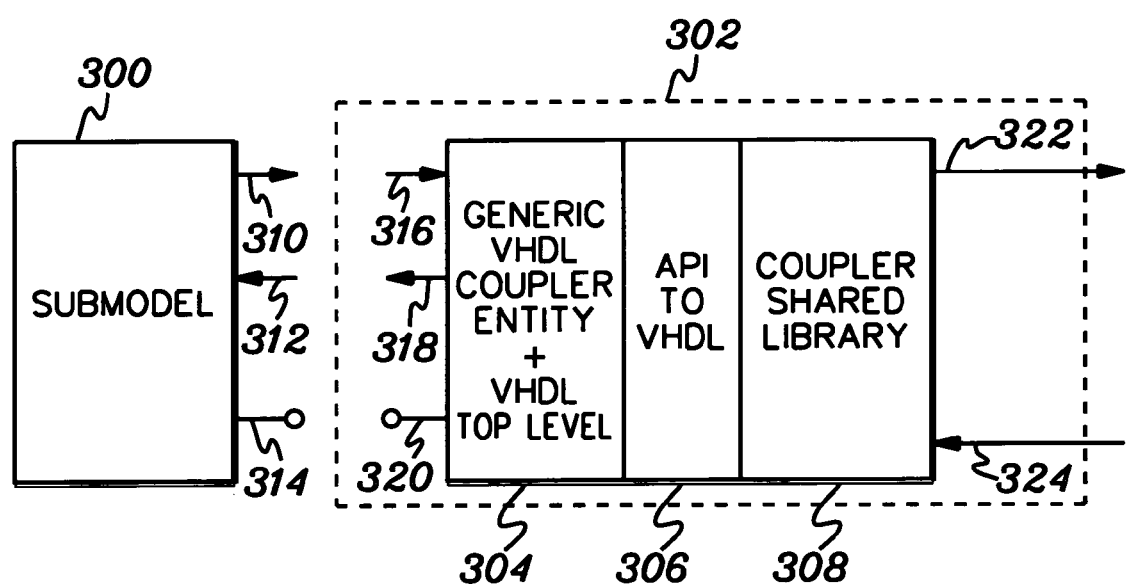
FIG. 3 depicts one example of a generic coupler and its interface to a submodel, in accordance with an aspect of the present invention.

Continuing with FIG. 3, input port 318 and output port 316 of the top level coupler entity 304 are mapped to inputs 312 and outputs 310, respectively, of submodel 300 to enable communication between the coupler and submodel. Clock/cycle port 320 is mapped to the clock/cycle port 314 of submodel 300 thereby enabling the coupler to detect the clock/cycle entity of the submodel. Coupler 302 employs a signal at clock/cycle port 314 to collect data to be transmitted to another submodel from outputs 310, and to pass data from the CCD to inputs 312. Further, coupler 302 includes coupler shared library 308. The coupler shared library contains functions which enable coupler 302 to control data flow from and to the submodel.

In one embodiment, detection of a change on the clock/cycle port 314 causes invocation of the coupler shared library 308. Coupler 302 uses functions provided by the coupler shared library (see FIGS. 5-8) to gather output values from the submodel and to communicate this information to an output destination, for example, the CCD; or to gather input information from an input source, for example, the CCD, and to pass this information into the submodel.

In one example, the coupler shared library can be implemented using C programming language. In this example, coupler 302 could further include an application programming interface to VHDL 306, to interface the top level coupler entity with the coupler shared library.

Certain aspects of the logic provided by the coupler shared library and used by the coupler to input data from the CCD and to output data to the CCD are described in detail below with reference to FIGS. 5-8.

To transmit data from one submodel to another, the data to be transmitted is first outputted to the CCD. In one embodiment, this data is written to a file according to the logic illustrated in FIG. 5.

Initially, the coupler retrieves data to be written 500, i.e., obtains the data from the submodel. In one embodiment, a copy of this data is stored by the coupler in a local storage (not shown). This stored data may be needed in the next cycle to perform a retransmit function. The coupler then opens for reading 502 a file intended for writing, reads the file and checks 504 each record for a retransmit request. A retransmit request would be written to the file by an earlier reader that found the data in the file to be incorrect. In a highly reliable environment, an ability to retransmit data might optionally be disabled to improve overall speed. An example of logic used to write a retransmit request to the file is described further below with reference to FIG. 8.

Figure 5:
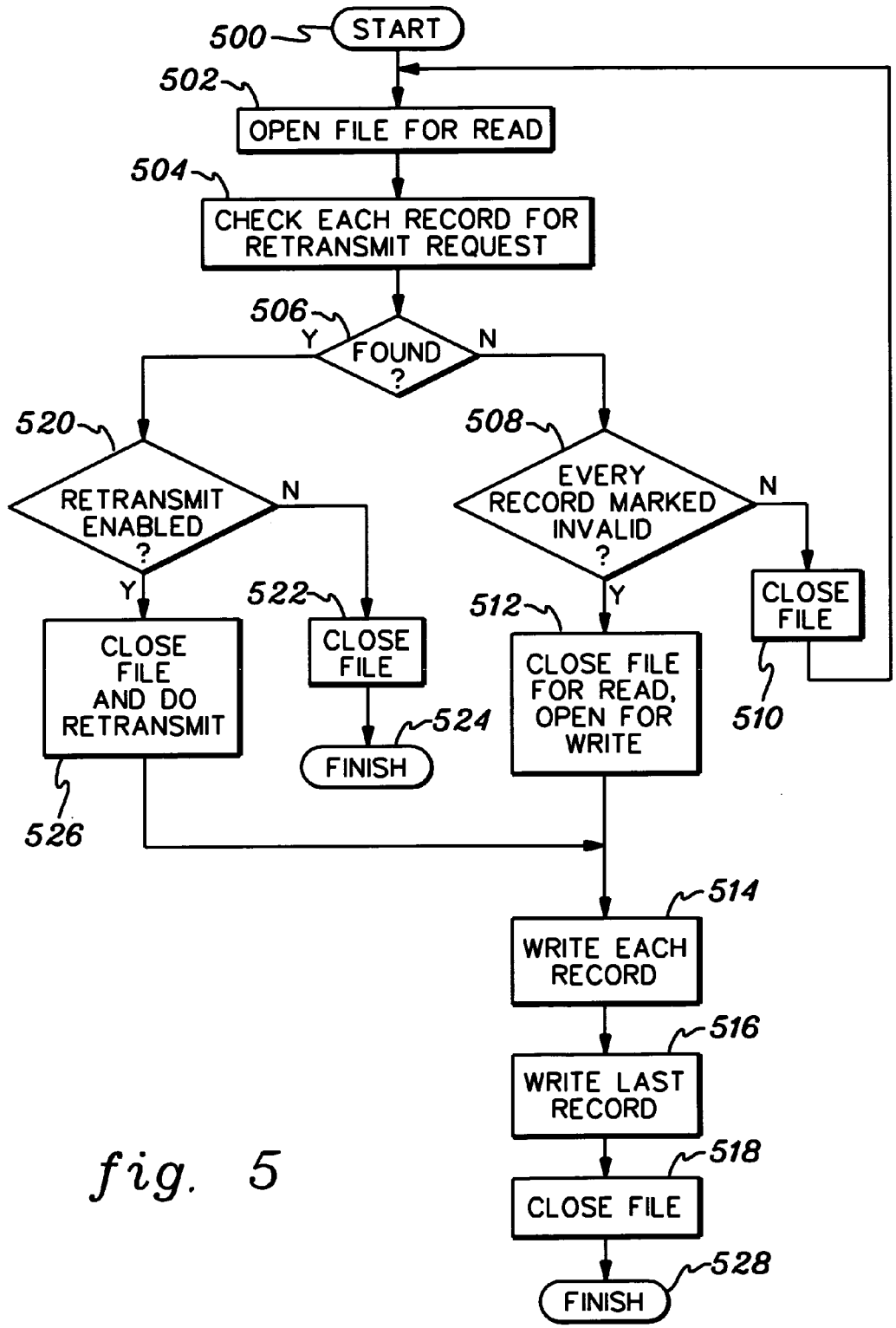
FIG. 5 depicts one example of logic used by a coupler shared library to write outputs to a file, in accordance with an aspect of the present invention.

Continuing with FIG. 5, if a retransmit request is found 506, then the coupler checks 520 whether retransmits are enabled. If yes, the file is closed and the coupler calls 526 a retransmit function. One embodiment of a retransmit function is described further below with reference to FIG. 6. The retransmit function provides the coupler with data stored in the local storage in the previous cycle, and is ready to continue writing data 514 to the file. If data retransmits are not enabled, then the file is closed 522 and the coupler finishes 524 the writing procedure. In one embodiment, a log file can be created with the description of any problem encountered.

If a retransmit request is not found, then the coupler proceeds with checking 508 records for an INVALID character. If every record lacks this character, then this file has not been read to completion and should not be overwritten. In this case, the coupler closes the file 510 and starts the writing procedure from the beginning 502. If all records are marked INVALID, then the file is ready to be overwritten. The coupler closes the file for reading and opens it for writing 512.

Next, the coupler writes data 514 to the file. In one embodiment, the coupler writes each record of the file with a VALID character, a sequential record number, a correct and identical cycle number and a record specific data. The cycle number specifies the clock cycle to which the data pertains. The sequential record number represents, in one embodiment, an ordinal number of each record in the file, and might be used for error checking. A checksum is preferably computed, and can be written to the last record of the file 516 as a record specific data. In one embodiment, the checksum is computed by applying an exclusive OR operation to all records of the file in hexadecimal format. After this, the file is closed 518 and the writing procedure finishes 528.

Figure 6:
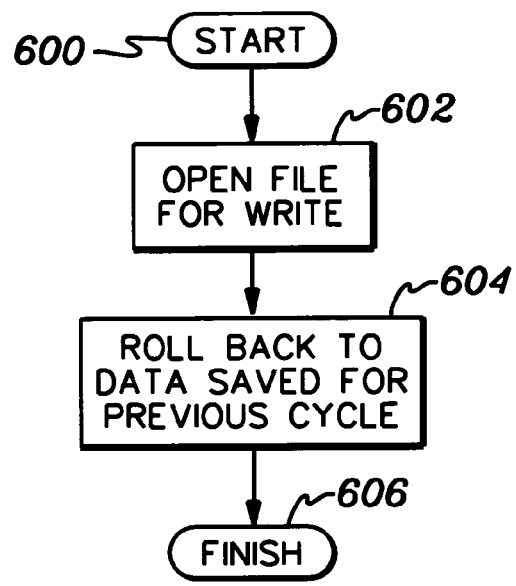
FIG. 6 depicts one example of logic used by a coupler shared library to perform a retransmit in accordance with an aspect of the present invention.

One embodiment of logic used by the coupler to perform a retransmit function is described below with reference to FIG. 6.

Upon starting 600, the coupler opens a file for writing 602. The coupler then obtains data stored from a previous cycle 604, and prepares to write it to the file 606. After this, the coupler proceeds with the writing procedure.

Figure 7:
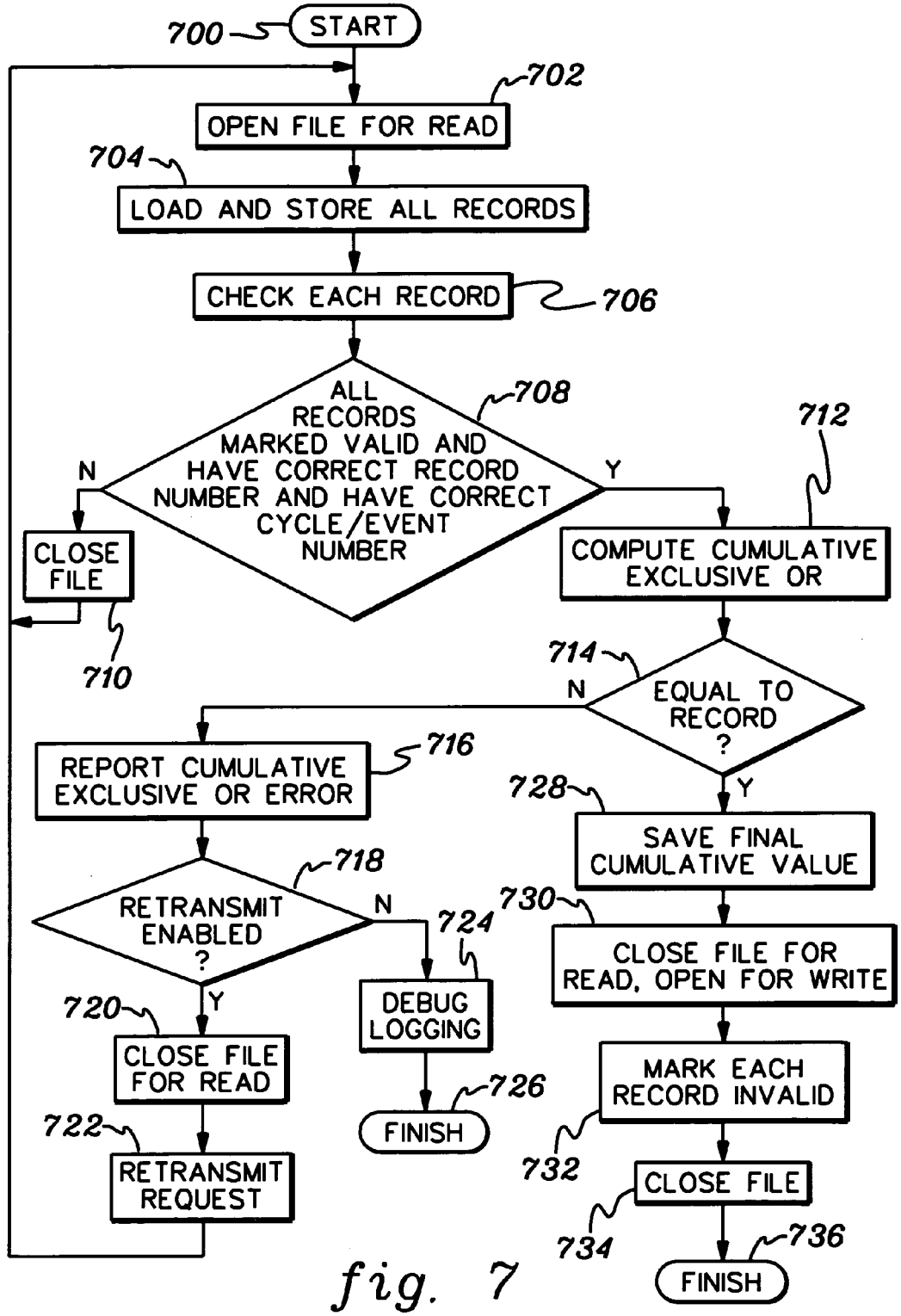
FIG. 7 depicts one example of logic used by a coupler shared library to read inputs from a file, in accordance with an aspect of the present invention.

The second part of data transmission is retrieving data from the CCD for input to a submodel by the associated coupler. In one embodiment, this data is read from a file according to the logic, such as depicted in FIG. 7.

First, a coupler detects via the clock/cycle port that its submodel needs data and starts the reading procedure 700. The coupler opens for reading 702 a file in the CCD which contains data to be inputted to the submodel. The data is then loaded from the file 704 by the coupler.

Next, records of the file are checked 706 for VALID characters, correct sequential record numbers and correct and identical cycle numbers 708. Since one submodel can be processed faster than other submodels, the data in the file may not yet be ready for reading. If any record has any incorrect data, the file is closed 710 and the reading procedure is repeated 702.

If all records are ready to be read and contain correct data, the coupler computes 712 a checksum value by computing the cumulative exclusive OR for all records in hexadecimal format. The last record is excluded from the computation, since it contains the checksum value. Then, the computed checksum value is compared 714 to the value stored in the last record.

If the checksum values do not match, then the coupler reports an error 716 and checks whether retransmits are enabled 718. If they are, the file is closed for reading 720 and the coupler starts a retransmit request procedure 722. One example of logic used in a retransmit request function is described below with reference to FIG. 8. After the retransmit is requested, the reading procedure is repeated 702. The reading procedure will be repeated until a retransmission is performed by the next writer. If retransmits are not enabled, the coupler closes the file, and performs a debug logging function 724 before finishing 726.

If values match, the coupler proceeds with storing the final checksum value 728 for the next cycle. Next, the file is closed for reading, and opened for writing 730 to be able to inform future readers of the file that it has already been read. To do that, the coupler marks each record INVALID 732. The file is closed 734 and the coupler finishes the reading procedure 736. At this point the coupler has the data read from the file and can pass it to the submodel via the submodel's input(s).

One example of logic which can be used by the coupler to request a retransmission of data is described below with reference to FIG. 8.

Figure 8:
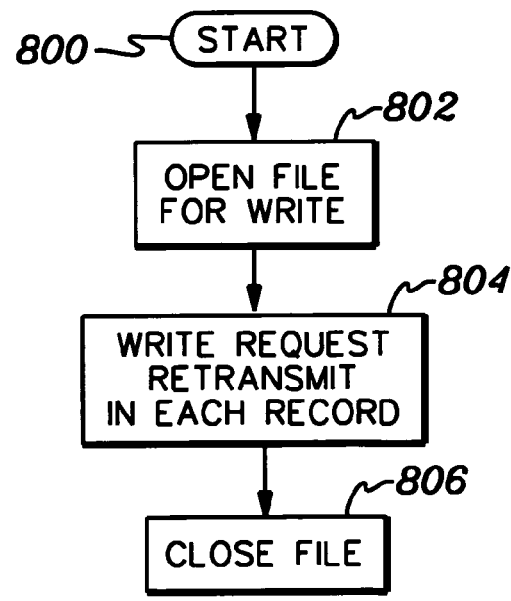
FIG. 8 depicts one example of logic used by a coupler shared library to request a retransmit of data, in accordance with an aspect of the present invention.

The procedure of FIG. 8 is started 800 when a coupler encounters a checksum error during the reading process. First, the coupler opens the file for writing 802, writes 804 a retransmit request in each record of the file and closes 806 the file. This will inform the next writer that the retransmit function should be executed (as shown in FIGS. 5–6). The coupler thereafter proceeds with the reading procedure.

In one embodiment, logic for ensuring file integrity can be removed from the above process flows to improve overall processing speed, i.e., if the processing system's reliability is high enough, as will be apparent to those skilled in the relevant art. In such an embodiment, the writing procedure contains no checking, whereas the reading procedure checks only the cycle number. The submodel which is processed faster is forced to wait for submodels which are processed slower and to reread the file in order to keep the collective in synchrony. In contrast, the slowest submodel will always have input data ready and will have a zero reread count. The reread count then would be a measure of load on the processing computing units, with low reread counts indicating larger loads or slower computing units.

In one embodiment, reread count statistics can be available for static repartitioning of submodels between simulation runs. In another embodiment, reread count statistics could be used for dynamic allocation of computing resources to a slower application instance, for example, by raising a priority of this slower application instance. In this embodiment, a slow point (slow instance) could change over the set of instances without loss of forward progress computational speed for the collective model. In yet another embodiment, the reread count statistics across all computing units in a collective could be used as a measure of overall performance of the collective.

In a further embodiment, data ready to be written to the file can be concatenated into one record, and thus a single write would be needed to output the data. Similarly, a single read would be needed to input the data from the file. The data obtained from the file in the single read could be parsed on the input side.

In yet another embodiment, each instance of a hardware simulator or an application program processing a submodel could be started asynchronously across a series of computers. Each instance would advance only until the input or output resource forces it to wait. In this way, the instances can be started disconnected in batch and will be able to proceed as long as updates are being made to files in the CCD by other members of the collective. Similarly, a foreground session with keyboard input can be used to advance or hold an entire collective at a prescribed point.

A disclosed coupling mechanism permits the slowest submodel instance to execute at its maximum attainable rate by minimizing the time that the instance expends on obtaining required information from faster instances. Faster instances are forced to wait for the information and to invest their computing resources in determining whether or not their next required piece of information is available so that these instances may then continue. This avoids spending resources on prediction and subsequent back up with recomputation.

Described above are various aspects of processing a model in accordance with the present invention. A method for distributed processing of a partitioned model, as well as techniques for connecting and controlling submodels being processed on different computing units, are provided. The various techniques described herein are applicable to single systems, homogeneous systems, as well as heterogenous systems. As one example, multiple submodels can be processed by different hardware simulators on the same physical machine.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

The invention claimed is:

1. A method of processing multiple submodels of a partitioned model, the multiple submodels including a first submodel and a second submodel, said method comprising:
 employing an application programming interface of a hardware simulator and coupler software to couple a first submodel and a second submodel of a partitioned model, said application programming interface and said coupler software being separate from and external to said partitioned model, said employing comprising:
  providing a first software coupler separate from and interfaced with said first submodel;
  providing a second software coupler separate from and interfaced with said second submodel;
  interfacing said first software coupler and said second software coupler, said interfacing comprising providing a data storage buffer between said first coupler and said second coupler;
  hubless processing said first submodel and said second submodel, wherein said first submodel and said second submodel communicate directly employing said first coupler, said data storage buffer and said second coupler; and
  wherein said hubless processing comprises transmitting data to said data storage buffer by said first coupler, said data being obtained from said first submodel, retrieving said data from said data storage buffer by said second coupler and providing said data to said second submodel.

2. The method of claim 1, wherein said model is a logic design.

3. The method of claim 1, wherein said processing comprises hubless distributively processing said first submodel and said second submodel.

4. The method of claim 1, wherein said hubless processing further comprises processing said first submodel on a first simulator instance, and processing said second submodel on a second simulator instance, said first simulator instance being different from said second simulator instance, said first simulator instance employing said data storage buffer to communicate with said second simulator instance.

5. The method of claim 4, wherein said first simulator instance resides on a first computing unit and said second simulator instance resides on a second computing unit.

6. The method of claim 1, wherein at least one submodel and associated coupler include at least one mapped data port and a clock/cycle port, said clock/cycle port providing at least one clock/cycle signal, said at least one clock/cycle signal being employed to transfer data between said at least one submodel and associated coupler through said at least one mapped data port.

7. The method of claim 6, wherein at least one of said first coupler and said second coupler comprises a top level coupler entity and a coupler shared library, said at least one first coupler and second coupler employing said top level coupler entity to connect to said respective first submodel and second submodel, wherein said top level coupler entity comprises multiple ports mapped to said at least one input, said at least one output and said clock/cycle port of said at least one first submodel and second submodel, at least one of said first coupler and said second coupler employing said coupler shared library to transmit data between said software coupler and said data storage buffer.

8. The method of claim 1, wherein said hubless processing further comprises:
 commensurate with said transmitting and retrieving of said data, ensuring integrity of said data.

9. The method of claim 8, wherein said ensuring integrity comprises:
 inserting a checksum value into said data;
 checking said data in said data storage buffer to determine correctness of said data by at least one of said first coupler and said second coupler; and
 at least one of retransmitting said data to said data storage buffer and rereading said data from said data storage buffer by said at least one first coupler and second coupler, if said data is incorrect.

10. The method of claim 9, wherein said inserting comprises calculating said checksum value, said calculating comprising applying at least one logical operation to said data.

11. The method of claim 9, wherein said checking comprises:
   calculating a new checksum value for said data; and
   comparing said new checksum value with said checksum value.

12. The method of claim 8, wherein said ensuring integrity further comprises:
   providing a first series of files in said data storage buffer write accessible by said first coupler and read accessible by said second coupler;
   providing a second series of files in said data storage buffer read accessible by said first coupler and write accessible by said second coupler;
   writing to said first series of files by said first coupler and reading data from said first series of files by said second coupler in a predefined order; and
   writing to said second series of files by said second coupler and reading data from said second series of files by said first coupler in said predefined order.

13. The method of claim 1, wherein said interfacing further comprises monitoring data in said data storage buffer to provide monitoring statistics, said monitoring statistics facilitating statically repartitioning said first submodel and said second submodel to optimize said hubless processing.

14. The method of claim 1, wherein said model is represented in VHDL.

15. A system for processing multiple submodels of a partitioned model, the multiple submodels including a first submodel and a second submodel, said system comprising:
   means for employing an application programming interface of a hardware simulator and coupler software to couple a first submodel and a second submodel of a partitioned model, said application programming interface and said coupler software being separate from and external to said partitioned model, said means for employing comprising:
      means for providing a first software coupler separate from and interfaced with said first submodel;
      means for providing a second software coupler separate from and interfaced with said second submodel;
      means for interfacing said first software coupler and said second software coupler, said means for interfacing comprising means for providing a data storage buffer between said first coupler and said second coupler;
   means for hubless processing said first submodel and said second submodel, wherein said first submodel and said second submodel communicate directly employing said first coupler, said data storage buffer and said second coupler; and
   wherein said means for hubless processing comprises means for transmitting data to said data storage buffer by said first coupler, said data being obtained from said first submodel, and means for retrieving said data from said data storage buffer by said second coupler and for providing said data to said second submodel.

16. The system of claim 15, wherein said model is a logic design.

17. The system of claim 15, wherein said means for processing comprises means for hubless distributively processing said first submodel and said second submodel.

18. The system of claim 15, wherein said means for hubless processing further comprises means for hubless processing said first submodel on a first simulator instance, and means for hubless processing said second submodel on a second simulator instance, said first simulator instance being different from said second simulator instance, said first simulator instance employing said data storage buffer to communicate with said second simulator instance.

19. The system of claim 18, wherein said first simulator instance resides on a first computing unit and said second simulator instance resides on a second computing unit.

20. The method of claim 15, wherein at least one submodel and associated coupler include at least one mapped data port and a clock/cycle port, said clock/cycle port providing at least one clock/cycle signal, said at least one clock/cycle signal being employed to transfer data between said at least one submodel and associated coupler through said at least one mapped data port.

21. The system of claim 20, wherein at least one of said first coupler and said second coupler comprises a top level coupler entity and a coupler shared library, said at least one first coupler and second coupler employing said top level coupler entity to connect to said respective first submodel and second submodel, wherein said top level coupler entity comprises multiple ports mapped to said at least one input, said at least one output and said clock/cycle port of said at least one first submodel and second submodel, at least one of said first coupler and said second coupler employing said coupler shared library to transmit data between said software coupler and said data storage buffer.

22. The system of claim 15, wherein said means for processing further comprises:
   means for ensuring integrity of said data during said transmitting and retrieving of said data.

23. The system of claim 22, wherein said means for ensuring integrity comprises:
   means for inserting a checksum value into said data;
   means for checking said data in said data storage buffer to determine correctness of said data by at least one of said first coupler and said second coupler; and
   means for retransmitting said data to said data storage buffer and for rereading said data from said data storage buffer by said at least one first coupler and second coupler, if said data is incorrect.

24. The system of claim 23, wherein said means for inserting comprise means for calculating said checksum value, said means for calculating comprising means for applying at least one logical operation to contents of said data.

25. The system of claim 23, wherein said means for checking comprises:
   means for calculating a new checksum value for said data; and
   means for comparing said new checksum value with said checksum value.

26. The system of claim 22, wherein said means for ensuring integrity further comprises:
   means for providing a first series of files in said data storage buffer write accessible by said first coupler and read accessible by said second coupler;
   means for providing a second series of files in said data storage buffer read accessible by said first coupler and write accessible by said second coupler;
   means for writing to said first series of files by said first coupler and reading data from said first series of files by said second coupler in a predefined order; and
   means for writing to said second series of files by said second coupler and reading data from said second series of files by said first coupler in said predefined order.

27. The system of claim 15, wherein said means for interfacing further comprises means for monitoring data in said data storage buffer to provide monitoring statistics, said monitoring statistics facilitating statically repartitioning said first submodel and said second submodel to optimize said hubless processing.

28. The system of claim 15, wherein said model is represented in VHDL.

29. A simulation system for processing multiple submodels of a model, the multiple submodels comprising a first submodel and a second submodel, said simulation system comprising:
- at least one computing unit having an application programming interface of a hardware simulator and coupler software coupling a first submodel and a second submodel of a partitioned model by providing a first software coupler interfaced with said first submodel, a second software coupler interfaced with said second submodel, and by interfacing said first software coupler and said second software coupler with a data storage buffer disposed between said first coupler and said second coupler, said application programming interface and said coupler software being separate from and external to said partitioned model; and
- wherein said at least one computing unit hublessly processes said first submodel and said second submodel, wherein said first submodel and said second submodel communicate directly employing said first coupler, said data storage buffer and said second coupler, said communicating comprising transmitting data to said data storage buffer by said first coupler, said data being obtained from said first submodel, retrieving said data from said data storage buffer by said second coupler and providing said data to said second submodel.

30. The simulation system of claim 29, wherein said at least one computing unit comprises multiple simulator instances, said multiple simulator instances including a first simulator instance and a second simulator instance, said first simulator instance processing said first submodel and said second simulator instance processing said second submodel, said first simulator instance being different from said second simulator instance.

31. The simulation system of claim 30, wherein said first simulator instance resides on a first computing unit and said second simulator instance resides on a second computing unit.

32. At least one program storage device readable by a machine, tangibly embodying at least one program of instructions executable by the machine to perform a method of processing multiple submodels of a partitioned model, the multiple submodels including a first submodel and a second submodel, the method comprising:
- employing an application programming interface of a hardware simulator and coupler software to couple a first submodel and a second submodel of a partitioned model, said application programming interface and said coupler software being separate from and external to said partitioned model, said employing comprising:
  - providing a first software coupler separate from and interfaced with said first submodel;
  - providing a second software coupler separate from and interfaced with said second submodel;
  - interfacing said first software coupler and said second software coupler, said interfacing comprising providing a data storage buffer between said first coupler and said second coupler;
  - hubless processing said first submodel and said second submodel, wherein said first submodel and said second submodel communicate directly employing said first coupler, said data storage buffer and said second coupler; and
- wherein said hubless processing comprises transmitting data to said data storage buffer by said first coupler, said data being obtained from said first submodel, retrieving said data from said data storage buffer by said second coupler and providing said data to said second submodel.

33. The at least one program storage device of claim 32, wherein said model is a logic design.

34. The at least one program storage device of claim 32, wherein said processing comprises hubless distributively processing said first submodel and said second submodel.

35. The at least one program storage device of claim 32, wherein said processing further comprises processing said first submodel on a first simulator instance, and processing said second submodel on a second simulator instance, said first simulator instance being different from said second simulator instance, said first simulator instance employing said data storage buffer to communicate with said second simulator instance.

36. The at least one program storage device of claim 35, wherein said first simulator instance resides on a first computing unit and said second simulator instance resides on a second computing unit.

37. The at least one program storage device of claim 32, wherein at least one submodel and associated coupler include at least one mapped data port and a clock/cycle port, said clock/cycle port providing at least one clock/cycle signal, said at least one clock/cycle signal being employed to transfer data between said at least one submodel and associated coupler through said at least one mapped data port.

38. The at least one program storage device of claim 37, wherein at least one of said first coupler and said second coupler comprises a top level coupler entity and a coupler shared library, said at least one first coupler and second coupler employing said top level coupler entity to connect to said respective first submodel and second submodel, wherein said top level coupler entity comprises multiple ports mapped to said at least one input, said at least one output and said clock/cycle port of said at least one first submodel and second submodel, at least one of said first coupler and said second coupler employing said coupler shared library to transmit data between said software coupler and said data storage buffer.

39. The at least one program storage device of claim 32, wherein said processing further comprises:
- commensurate with said transmitting and retrieving of said data, ensuring integrity of said data.

40. The at least one program storage device of claim 39, wherein said ensuring integrity comprises:
- inserting a checksum value into said data;
- checking said data in said data storage buffer to determine correctness of said data by at least one of said first coupler and said second coupler; and
- at least one of retransmitting said data to said data storage buffer and rereading said data from said data storage buffer by said at least one first coupler and second coupler, if said data is incorrect.

41. The at least one program storage device of claim 40, wherein said inserting comprises calculating said checksum value, said calculating comprising applying at least one logical operation to said data.

42. The at least one program storage device of claim 40, wherein said checking comprises:
- calculating a new checksum value for said data; and
- comparing said new checksum value with said checksum value.

43. The at least one program storage device of claim 39, wherein said ensuring integrity further comprises:
- providing a first series of files in said data storage buffer write accessible by said first coupler and read accessible by said second coupler;
- providing a second series of files in said data storage buffer read accessible by said first coupler and write accessible by said second coupler;
- writing to said first series of files by said first coupler and reading data from said first series of files by said second coupler in a predefined order; and
- writing to said second series of files by said second coupler and reading data from said second series of files by said first coupler in said predefined order.

44. The at least one program storage device of claim 32, wherein said interfacing further comprises monitoring data in said data storage buffer to provide monitoring statistics, said monitoring statistics facilitating statically repartitioning said first submodel and said second submodel to optimize said hubless processing.

45. The at least one program storage device of claim 32, wherein said model is represented in VHDL.